United States Patent [19]

Horsfall et al.

[11] Patent Number: 5,631,601

[45] Date of Patent: May 20, 1997

[54] FM DEMODULATION WITH A VARIABLE GAIN PHASE LOCKED LOOP

[75] Inventors: Wayne L. Horsfall, Buckinghamshire, United Kingdom; Gary Shipton, Chemin due Trincon, France

[73] Assignee: SGS-Thomson Microelectronics Limited, United Kingdom

[21] Appl. No.: 175,976

[22] Filed: Dec. 30, 1993

[30] Foreign Application Priority Data

Sep. 29, 1993 [GB] United Kingdom .................. 9320067

[51] Int. Cl.⁶ ..................... H03D 3/00; H03L 7/08
[52] U.S. Cl. ................. 329/325; 329/319; 329/321; 331/15; 331/23; 455/208; 455/214; 455/337
[58] Field of Search .................. 329/318, 319, 329/325, 326, 321; 331/23, 10, 11, 12, 15, 16, 17; 455/208, 214, 234.2, 236.1, 240.1, 256, 260, 337

[56] References Cited

U.S. PATENT DOCUMENTS

| | | | |
|---|---|---|---|
| 3,209,271 | 9/1965 | Smith | 329/325 |
| 3,421,105 | 1/1969 | Taylor | 455/260 X |
| 3,551,829 | 12/1970 | Haggai | 331/23 X |
| 3,873,931 | 3/1975 | Basse et al. | 331/23 X |
| 3,976,943 | 8/1976 | Cipher et al. | |
| 4,107,624 | 8/1978 | Turner | 331/23 X |
| 4,270,221 | 5/1981 | Daniel, Jr. | 329/325 X |
| 4,336,616 | 6/1982 | Carson et al. | 331/12 X |
| 4,523,324 | 6/1985 | Marshall | 329/325 X |
| 4,568,888 | 2/1986 | Kimura et al. | 331/10 |
| 4,595,886 | 6/1986 | Mroch et al. | |
| 4,691,377 | 9/1987 | Yoshihara et al. | 455/256 |
| 4,743,867 | 5/1988 | Smith | 455/260 X |
| 4,792,993 | 12/1988 | Ma | 455/266 |
| 5,036,291 | 7/1991 | Marz | 331/23 X |
| 5,130,671 | 7/1992 | Shahriary et al. | 455/260 X |
| 5,384,550 | 1/1995 | Henely et al. | 331/17 |

FOREIGN PATENT DOCUMENTS

| | | |
|---|---|---|
| 62012288 | 1/1987 | Japan . |
| 2280492 | 11/1990 | Japan . |
| 3117203 | 5/1991 | Japan . |
| WO87/03760 | 6/1987 | WIPO . |

OTHER PUBLICATIONS

Watatani, Yoshizumi et al., IEEE Transactions On Consumer Electronics "The FM Audio Signal Recording System for 8 mm Video", vol. CE–30, No. 4, Nov. 1984, pp. 532–536.

Primary Examiner—David Mis
Attorney, Agent, or Firm—Felsman, Bradley, Gunter & Dillon, LLP

[57] ABSTRACT

A method of demodulating an FM carrier wave and an FM demodulation circuit are described which use a phase locked loop. An FM input signal including the carrier wave is supplied to a phase detector in the phase locked loop. The output of the phase detector is filtered and used to generate a signal for use in controlling a voltage controlled oscillator having an output also connected to the phase detector. The phase locked loop is tuned to a selected carrier wave frequency and a variable gain setting of a variable gain circuit in the phase locked loop is selected to select a desired loop gain. The signal for use in controlling the voltage controlled oscillator is varied by the variable gain circuit to alter the amount by which the frequency of the output of the voltage controlled oscillator changes in relation to a given output of the phase detector. The variable gain setting is selected to select a required bandwidth for demodulation.

31 Claims, 2 Drawing Sheets

FM DEMODULATION WITH A VARIABLE GAIN PHASE LOCKED LOOP

FIELD OF THE INVENTION

The invention relates to apparatus for and methods of demodulation of an FM sound carrier.

BACKGROUND TO THE INVENTION

Known demodulation systems for such FM sound carriers normally translate the frequency of the selected carrier to a known frequency and the signal is then processed by a single high Q narrow band pass filter. The single carrier frequency is then FM demodulated. Each of the carrier frequencies in the composite signal must be shifted to the same known frequency when it is required to tune onto that selected carrier frequency. To handle stereo signals two such filters are required and as the band pass filter used will have a selected bandwidth, it is necessary to use a plurality of filters to allow for the variation in modulation which may be permitted for different carrier frequencies. The use of such frequency translation to use a common filter presents more problems in providing an economic solution on integrated circuit chips.

Phase locked loops have been used for FM demodulation but have presented problems where a plurality of carrier waves of close frequency have been present. Such phase locked loop circuits have presented problems of stability due to variable gain with process variations particularly on an integrated circuit implementation and they have also been sensitive to variations in the input signal amplitude.

It is an object of the present invention to provide an improved apparatus and method for FM sound carrier demodulation using a phase locked loop.

SUMMARY OF THE INVENTION

The invention provides a method of demodulating an FM carrier wave by use of a phase locked loop circuit, which method comprises tuning the phase locked loop circuit to a selected carrier wave frequency, said tuning including selecting a setting of the variable gain circuit in the phase locked loop to select a desired loop gain.

The variable gain selection may be effected to select a required bandwidth for demodulation.

The setting of the variable gain circuit may be selected to compensate for gain variations in the phase locked loop due to process variation in manufacture of the circuit.

Preferably an FM input signal including said carrier wave is supplied to a phase detector in a phase locked loop circuit, the output of the phase detector is filtered and used to generate a signal for use in controlling a VCO having an output connected to said phase detector, said signal being varied by said variable gain circuit to alter the output of the VCO for a given output of the phase detector.

Preferably the method includes testing the slope of the VCO by measuring the variation of frequency output with the change of voltage input and determining the gain of the variable gain circuit in accordance with the slope detected.

Preferably the variation in frequency output of the VCO with the change of voltage input is supplied to a microcontroller which is used to control switching of resistance elements to vary the gain of the variable gain circuit. The variable gain circuit may be programmed to select one of a plurality of variable gain stages which may be provided by a plurality of switchable resistance elements.

The invention is particularly applicable to the demodulation of a selected carrier wave forming part of an input including a plurality of carrier waves of different bandwidths.

The invention is particularly applicable to the demodulation to detect high quality audio signals and may be applied to signal received by a satellite receiver.

The invention also provides a phase locked loop circuit for demodulating an FM carrier wave which circuit comprises a phase detector and a voltage controlled oscillator responsive to an output of the phase detector and arranged to provide an input to the phase detector for comparison with said FM carrier wave, said circuit including a variable gain circuit operable to select a desired gain for the phase locked loop and thereby select a bandwidth for demodulation by the circuit.

Preferably said variable gain circuit comprises a variable amplifier circuit coupled between the phase detector and the VCO.

Preferably the variable gain circuit includes a plurality of switched resistors switchable to select a desired gain.

The invention may provide a method as aforesaid further comprising supplying an FM input signal to a gain control circuit, supplying an output from the gain control circuit to a phase locked loop circuit tuned to a selected carrier wave frequency, providing a first output of the phase locked loop, using said first output to generate tuned gain control signal dependent on the amplitude of the carrier wave to which the phase locked loop is tuned, using said tuned gain control circuit to control said gain control circuit and providing a second output of the phase locked loop representing the demodulated audio signal.

The FM input signal may comprise a plurality of carrier waves of different frequencies and the method may include forming an untuned gain control signal in dependence on the amplitude of the plurality of carrier waves in the input signal and using said untuned gain control signal as a control signal for said gain control circuit. Said untuned gain control signal may be used to control the gain control circuit prior to locking of the phase locked loop onto the selected carrier frequency and said tuned gain control circuit may be used to control the gain control circuit after said locking.

The invention also includes a phase locked loop circuit as aforesaid including a gain control circuit for receiving an FM input signal providing an output to the phase locked loop, said phase locked loop having a phase detector for tracking frequency variation in the carrier wave and an amplitude detector for detecting amplitude variation in the selected carrier wave and providing a tuned gain control signal, said amplitude detector being coupled to said gain control circuitry to control the gain when the phase locked loop circuit is locked onto the selected carrier wave.

A further amplitude detecting circuit may be coupled to receive a signal dependent on the amplitude of the FM input signal to generate an untuned gain control circuit dependent on all carrier waves in the FM input signal, said amplitude detecting circuit being connected to supply an untuned gain control signal to the gain control circuit.

An embodiment of the invention will now be described by way of example and with reference to the accompanying drawings.

DESCRIPTION OF THE PREFERRED EMBODIMENT

Figure 1:
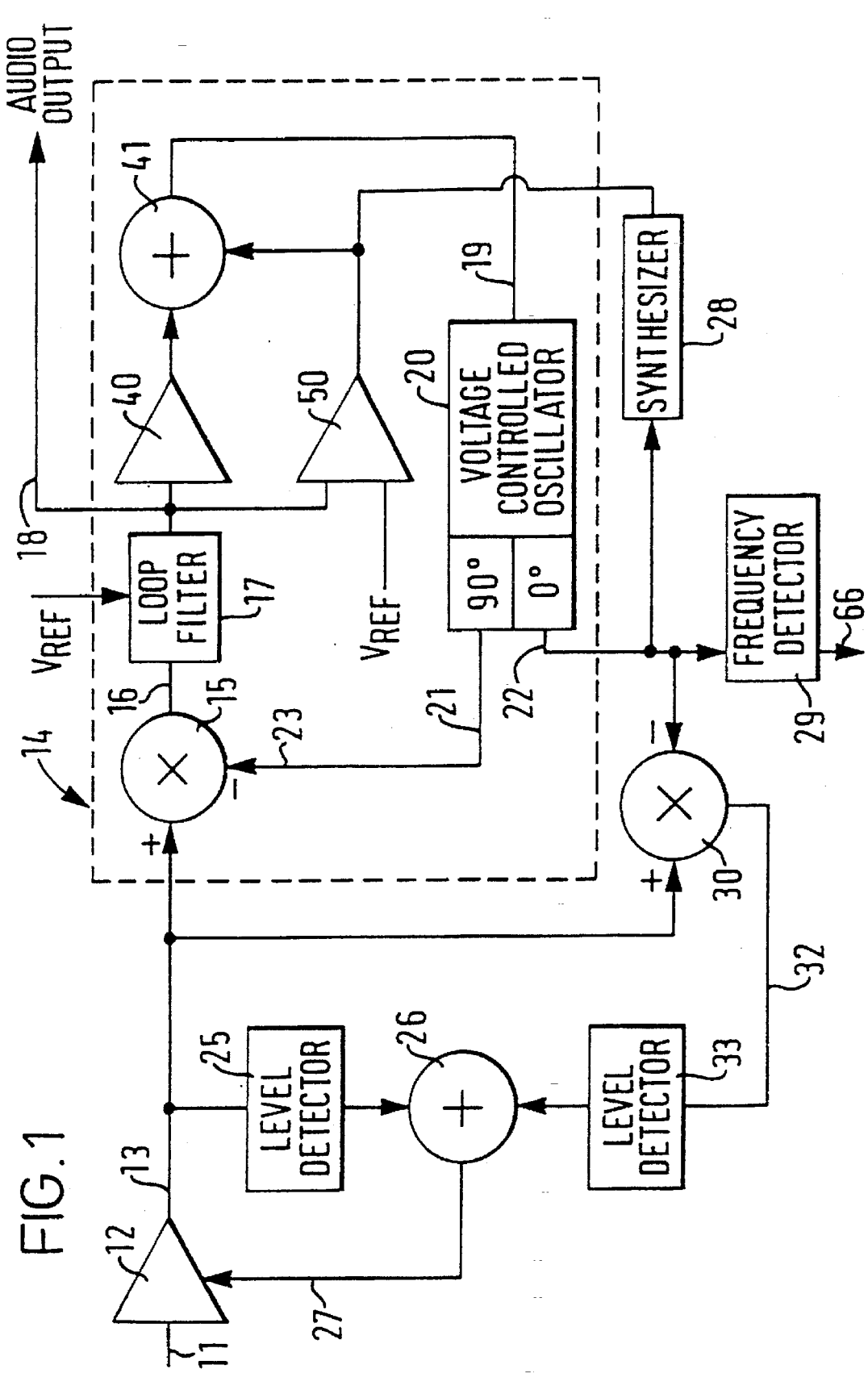
FIG. 1 shows a schematic diagram of a phase locked loop in an FM sound carrier demodulating circuit.

In this example an input signal 11 comprises a plurality of FM sound carriers received by, for example, a satellite receiver each carrier being in the range of 5 MHz to 10 MHz with a modulation varying between ±50 KHz to ±200 KHz. Each of the carrier frequencies is separated from an adjacent carrier by more than 180 KHz and the modulation of each signal is arranged not to give a frequency overlap with the modulation of any adjacent carrier wave. The input signal 11 is fed to an automatic gain control circuit 12 having an output 13 forming an input to a phase locked loop circuit 14. The phase locked loop includes a phase detector 15 having an output 16 connected to a loop filter 17 acting as a low pass filter arranged to pass audio signals, for example up to 20 KHz, without attenuation but with a sharp increase in attenuation at frequencies above this with particularly heavy attenuation of signals at 80 KHz. The output of the filter 17 forms an audio output 18 and is passed through a programmable gain control circuit 40 and voltage divider circuit 41 to form a voltage input 19 to a voltage controlled oscillator 20. The voltage controlled oscillator 20 is arranged to provide two outputs 21 and 22 with a 90° phase separation between them. Output 21 forms a second input 23 to the phase detector 15. In known manner for using a phase locked loop for demodulation, the phase detector 15 provides an output 16 used to control the voltage controlled oscillator 20 so that the voltage controlled oscillator 20 tracks frequency variations in the input signal 13 to the phase locked loop. In tracking those frequency variations the variation in voltage on lines 18 and 19 represents the modulation and thereby the audio signal carried by the input carrier wave on line 13. In the present case the phase detector 15 is arranged to provide a current output signal which is converted to a voltage signal by the loop filter 17 and that voltage is used as an input to the voltage controlled oscillator 20. The phase detector 15 comprises a Gilbert multiplier circuit arranged to provide a current output having a magnitude representing phase difference between the input signals 13 and 23 when they have the same frequency, representing the rate of change of frequency in the input signal 13. When the input signals 13 and 23 have a different frequency the output of the phase detector 15 is a periodic output at the difference frequency.

It will be understood that the FM input signal 11 consists of a plurality of carrier waves of different frequencies and amplitudes. In this case, the output of the phase detector will consist of a signal representing the rate of change of frequency or FM modulation of the carrier wave at the locked on frequency and signals at the difference frequencies between the locked on frequency and the frequency of each of the other carrier waves. Prior to locking on, the output 13 of the gain control circuit 12 is supplied to a first level detector 25 which measures the peak amplitude of all carrier waves on line 13. This is fed through a summing circuit 26 to line 27 forming an input to the automatic gain control 12. In this way the gain effected by the gain control circuit 12 is dependent on the peak amplitude of the carrier waves on line 13. This puts the amplitude of the input signals forming an input to phase detector 15 within an amplitude range to which the detector can respond. The phase locked loop is tuned to a selected carrier frequency by use of a synthesizer 28 which provides a voltage input to the voltage controlled oscillator 20 through the voltage divider circuit 41 to bring the output frequency of the oscillator to that of the required carrier frequency. The voltage divider circuit 41 is not a true voltage divider but provides a translated voltage to the VCO 20. A simple implementation is a series resistance network having two resistors connected to a common node, where $R_1$ and $R_2$ are the values of the resistors in the resistive network. The output to the VCO 20 is taken at the common node between $R_1$ and $R_2$, where $R_2$ is connected to the synthesizer 28 and $R_1$ is connected to the loop filter 17. The "divider ratio" $r=R_2/R_1+R_2$ and is set to be much less than 1. This arrangement has several advantages. Principally, it allows the VCO 20 to be controlled not only as part of the PLL 14 of the invention for FM demodulation but also to be used to set the operating carrier frequency of the PLL using the frequency synthesizer 28. This obviates the need for a separate local oscillator within the synthesizer 28. Provided that the dividing ratio is set to be much greater than one, the VCO 20 will appear to have a large dynamic range from the point of view of adjustment by the synthesizer but to be sensitive over a smaller range as seen within the PLL 14. Thus, the effective slope S for the VCO 20 when controlled by the synthesizer is S MHz/V, while the effective slope for the VCO 20 when operating within the PLL is ArS MHz/V where A is the gain of the programable gain control circuit 40. It also allows the audio level taken out of the PLL on line 18 to be delivered at its maximum. For example, the gain of the PLL can be set to deliver an audio level of IV peak to peak. Furthermore, the audio bias can be maintained at a preset level, for example 2.4V, by the voltage reference at the loop filter Vref. Both of these conditions can be achieved because the audio signal is taken upstream of the voltage divider circuit 41 and so is not affected by the signal reduction therein.

A frequency detector 29 is connected to receive the output 22 of the VCO 20 to monitor the frequency of the PLL. The output 22 from the oscillator 20 is also supplied to the synthesizer 28 so as to adjust the input voltage to the oscillator 20 until it is providing an output on lines 21 and 22 which is equal to that of the carrier frequency to which the PLL is tuned. The circuit 50 helps to prevent drift of the tuned voltage from the synthesizer 28 applied to the voltage divider circuit 41. At this point the phase detector 15 will be receiving the tuned carrier frequency on input 23 and the composite carrier frequency signals on line 13. The phase locked loop 14 will act to lock onto the selected carrier frequency which is input on line 13. The phase detector 15 will compare the input 23 with all carrier frequencies arriving on the line 13 but in the case of all carrier frequencies other than the selected carrier frequency, the output on line 16 will have a high frequency representing the difference between the frequency of signal on line 23 and the various carrier frequencies. The low pass filter 17 will filter out all signals which result from comparison of input 23 with carrier frequencies other than the selected frequency. As the frequency of the selected carrier varies due to its modulation, the phase detector 15 will provide an output signal 16 which generates a voltage input at 19 to the voltage controlled oscillator 20 to make the voltage controlled oscillator track the modulation of the selected carrier wave. It is important that this tracking should be independent of the amplitude of the selected carrier wave. For this reason the output 22 of the voltage controlled oscillator 20 is supplied to the further mixer circuit 30 which is of the same construction as the mixer 15. The mixer 30 has an input 31 derived from line 13 as well as the input derived from line 22 from the voltage controlled oscillator 20. Due to the 90° phase shift between lines 21 and 22 the mixer 15 will act as a phase detector for the selected carrier frequency and mixer 30 will act as an amplitude detector for the selected carrier frequency. In this way mixer 30 provides an output 32 which represents the amplitude of the selected carrier wave at any time and this is fed through a further level detector circuit 33 providing an input through unit 26 to line 27 and thereby control the automatic gain control unit 12. In this way, level detector 25 initially provides an untuned gain control which controls the operation of the automatic gain control circuit 12 setting a maximum level for the output signal 13. Once the phase locked loop 14 has locked onto the selected carrier frequency the signal derived from level detector 33 provides a tuned gain control which overrides control of the automatic gain control circuit 12 so as to control the signal level on line 13 in dependence on the amplitude of the tuned carrier frequency. The level detector 33 operates to vary the gain control 12 to signal levels below that initially set by level detector 25. In this way the input on line 13 to the phase detector 15 is made independent of the amplitude of the tuned carrier frequency. In this case the phase locked loop 14 is formed as a single integrated circuit on a single chip and the mixer 30 is formed on the same integrated circuit chip and has the same circuit design and made by the same process of manufacture so that the gain characteristics of mixer 30 are the same as those for mixer 15. In this way, the phase locked loop 14 automatically compensates for any amplitude variation of the carrier wave to which it is tuned.

Figure 2:
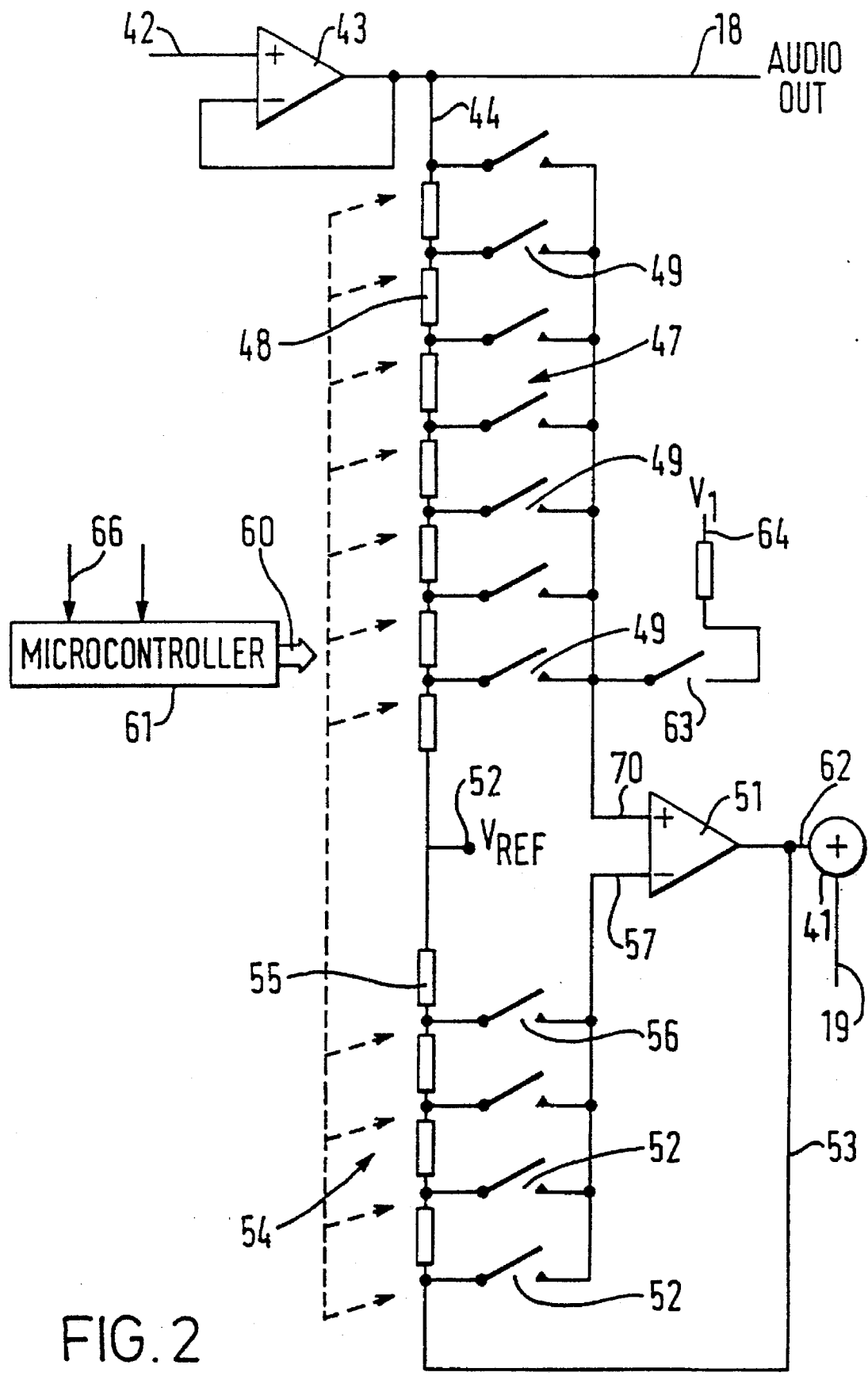
FIG. 2 shows a programmable gain control circuit for use with the apparatus of FIG. 1.

The gain of the phase locked loop is carefully controlled by circuit 40 so as to produce a stable loop producing rapid and stable lock onto the tuned frequency. The gain is such that the voltage controlled oscillator 20 provides a frequency variation on line 23 matching the required bandwidth of the carrier wave to which the PLL is tuned. By control of the bandwidth the lock range of the PLL circuit is controlled so as to avoid locking onto signals having bandwidths outside the desired lock range. Similarly the capture range of the circuit is determined by the time constant of the loop filter 17. This is arranged to limit the variation of input frequency from the tuned carrier frequency which can be captured by the PLL. As the gain of the phase detector 15 is dependent on the amplitude of the input signal on line 13 the stabilisation of amplitude which is achieved for the tuned carrier wave frequency results in a stabilised gain for that carrier frequency assisting in stable locking onto the required carrier frequency. In this way the control of the automatic gain control circuit 12 in dependence on the amplitude detected by the mixer 30 prevents a tendency for the loop to jump onto unwanted carrier frequencies. The operation of the programmable gain control circuit 40 will now be described with reference to FIG. 2 which shows more detail of the circuit 40. An output 42 is derived from the output of the loop filter 17 and passed to an amplifier 43. One output from the amplifier 43 is used to form the audio output 18 and a second output 44 is fed to a resistor bank 47 consisting of seven resistors 48 arranged in series between respective nodes to form a voltage divider. Each node has an associated switch 49 so that any one of the nodes may be selectively programmed to determine the resistors connected between line 44 and an input 70 to an amplifier 51, and thus the voltage division ratio. The resistor bank 47 is also connected to a voltage reference source 52. The amplifier 51 has a feedback circuit 53 which is connected to a second resistor bank 54 consisting of four serially arranged resistors 55 each having a separate selection switch 56 so that any one of the resistors 55 can be programmed to form a resistive path on a second input 57 to amplifier 51. The resistor bank 54 is also connected to the reference voltage supply 52. Each of the switches 49 and 56 is controlled by signals on a bus 60 from a microcontroller 61. By selectively switching in or out any one of the resistors in the first resistor bank 48 and the second resistor bank 54, the input signal 44 is subject to a controllable gain by the amplifier 51 so as to alter the output signal 62 which is supplied to the summing unit 41 leading to the input 19 to the voltage controlled oscillator 20. The input 70 to the amplifier 51 is also connected through a selector switch 63 to a further reference voltage supply 64.

Thus, the first resistor bank 48 forms a voltage divider while the second resistor bank 54 forms a voltage divider in the amplifier feedback, allowing its gain to be varied with respect to Vref, for example 2.4V. In use, it is necessary to carefully control the gain of the phase locked loop 14 both to allow selection of one of a plurality of possible bandwidths for the carrier wave which is to be demodulated and also to compensate for gain variations due to variations in the manufacturing process. The process variations are particularly important when the circuit is made as an integrated circuit on a single chip so that the component values cannot be selected by choice of external components. In order to compensate for gain variations due to manufacturing processes the loop gain must first be calibrated. This is carried out by leaving switches 49 in an open position, closing switch 63 and closing a suitable one of switches 56 so that the voltage from the reference source 64 is applied through the amplifier 51 to provide an internal DC signal to the voltage controlled oscillator 20. To apply the reference voltage, the bottommost switch 56 is closed. Other, higher, references can be applied for calibration by closing different ones of the switches 56. A frequency detector 29 receives the output 22 from the VCO and may detect the output frequency for any one of the DC voltages applied on line 19 corresponding to closure of any one of the four switches 56. This enables the slope of the voltage controlled oscillator 20 output to be determined by the frequency detector 29 which provides an output 66 supplied to the microcontroller 61. The microcontroller is provided with a lookup table to determine which combination of switches 49 and 54 should be closed to provide any one of 28 gain steps for the gain control circuit 40 corresponding to the detected slope of the VCO 20. The microcontroller outputs appropriate signals on bus 60 to close appropriate switches 49 and 56 thereby compensating for process variations in the gain of the VCO 20.

The circuit of FIG. 1 can further be used to select any particular bandwidth for the carrier wave to be demodulated. This again will be determined by the overall loop gain. The switches in the circuit of FIG. 2 can therefore be further adjusted to vary the gain and the bandwidth of the loop.

When used in this way, the microcontroller does not output signals on bus 60 to close the switches selected above for process variation compensation. The look up table is modified to include information concerning the combination of switches to be selected for each of a plurality of FM deviations taking into account the determined process variation compensation which is required. Typical FM deviations are 50 KHz, 100 KHz, 150 KHz and 200 KHz. Thus, once calibration has been carried out, the microcontroller can store a plurality of preset gain options corresponding to the required deviations so that selection of a particular deviation is a simple matter for users of the circuit.

It will be appreciated that by allowing for programmable gain control within the phase locked loop it is possible to demodulate various carrier signals of differing bandwidths by use of a single programmable phase locked loop and thereby avoid the need for different filters corresponding to each required bandwidth.

The invention is not limited to the details of the foregoing examples.

What is claimed is:

1. A method of demodulating an FM carrier wave to generate a demodulated audio signal by use of a phase locked loop circuit in which an FM input signal including said carrier wave is supplied to a first input of a phase detector, the output of the phase detector being filtered by a loop filter and used to generate a signal for use in controlling a voltage controlled oscillator having an output connected to a second input of said phase detector, which method comprises tuning the phase locked loop circuit to a selected carrier wave frequency, said tuning including selecting a variable gain setting of a variable gain circuit in the phase locked loop to select a desired loop gain, wherein said signal for use in controlling the voltage controlled oscillator is varied by said variable gain circuit to alter the amount by which the frequency of the output of the voltage controlled oscillator changes in relation to a given output of the phase detector, the variable gain setting being selected to select a required bandwidth for demodulation, and wherein the filtered output of the phase detector represents said demodulated audio signal.

2. A method according to claim 1 in which the setting of the variable gain circuit is selected to compensate for gain variations in the phase locked loop due to process variation in manufacture of the circuit.

3. A method according to claim 1 wherein a default power up frequency is generated by the voltage controlled oscillator in response to a control voltage supplied from a signal translation circuit with respect to a tuning voltage.

4. A method according to claim 3 including testing the slope of the voltage controlled oscillator by measuring the variation of frequency output with the change of voltage input and determining the gain of the variable gain circuit in accordance with the slope detected.

5. A method according to claim 1 including testing the slope of the voltage controlled oscillator by measuring the variation of frequency output with the change of voltage input and determining the gain of the variable gain circuit in accordance with the slope detected.

6. A method according to claim 5 in which the variation in frequency output of the voltage controlled oscillator with change of voltage input is supplied to a microcontroller which is used to control switching of resistance elements to vary the gain of the variable gain circuit.

7. A method according to claim 1 or in which the variable gain circuit is programmed to select one of a plurality of variable gain stages.

8. A method according to claim 1 in which the variable gain circuit is programmed by selecting one of a plurality of switchable resistance elements connected to an amplifier.

9. A method according to claim 1 in which the FM carrier wave forms part of an input including a plurality of carrier waves of different bandwidths.

10. A method according to claim 1 in which the modulation of the FM carrier wave comprises an audio signal.

11. A method according to claim 1 further comprising supplying the FM input signal to a gain control circuit prior to supplying said FM signal to the phase detector of the phase locked loop, providing a first output of the phase locked loop, using said first output to generate a tuned gain control signal depending on the amplitude of the carrier wave to which the phase locked loop is tuned, using said tuned gain control signal to control said gain control circuit and providing a second output of the phase locked loop representing the demodulated audio signal.

12. A method according to claim 11 in which said FM input signal comprises a plurality of carrier waves of different frequencies, said method including forming an untuned gain control signal in dependence on the amplitude of all carrier waves in the input signal and using said untuned gain control signal to control the gain control circuit prior to locking of the phase locked loop onto the selected carrier frequency and using said tuned gain control signal to control the gain control circuit after said locking.

13. A phase locked loop circuit for demodulating an FM carrier wave to generate a demodulated audio signal which circuit comprises a phase detector having a first input for receiving said FM carrier wave, a filter for filtering an output of the phase detector and a voltage controlled oscillator responsive to the filtered output of the phase detector and arranged to provide a second input to the phase detector for comparison with said FM carrier wave, said circuit including a variable gain circuit operable to select a desired gain for the phase locked loop, wherein said filtered output of the phase detector is varied by said variable gain circuit to alter the amount by which the frequency of the output of the voltage controlled oscillator changes in relation to a given filtered output of the phase detector thereby selecting a bandwidth for demodulation by the circuit, and wherein the filtered output of the phase detector represents said demodulated audio signal.

14. A phase locked loop according to claim 13 in which said variable gain circuit comprises a variable amplifier circuit coupled between the phase detector and the VCO.

15. A phase locked loop circuit according to claim 13 or claim 14 in which the variable gain circuit includes a plurality of switched resistors switchable to select a desired gain.

16. A phase locked loop circuit according to claim 15 in which a plurality of resistor selections are provided, each selection corresponding to a different one of a variety of required bandwidths.

17. A phase locked loop circuit according to claim 13 or claim 14 including a signal translation circuit connected between the variable gain circuit and the voltage controlled oscillator.

18. A phase locked loop according to claim 17 wherein said signal translation circuit has an input for receiving a set up voltage for setting up a default frequency in the phase locked loop.

19. An FM demodulator for audio signals, which demodulator includes a phase locked loop circuit comprising a phase detector having a first input for receiving an FM carrier wave, a filter for filtering an output of the phase detector and a voltage controlled oscillator responsive to the filtered output of the phase detector and arranged to provide a second input to the phase detector for comparison with said FM carrier wave, said circuit including a variable gain circuit operable to select a desired gain for the phase locked loop, wherein said filtered output of the phase detector is varied by said variable gain circuit to alter the amount by which the frequency of the output of the voltage controlled oscillator changes in relation to a given filtered output of the phase detector thereby selecting a bandwidth for demodulation by the circuit, and wherein the filtered output of the phase detector represents a demodulated audio signal.

20. An FM demodulator according to claim 19 in which said variable gain circuit comprises a variable amplifier circuit coupled between the phase detector and the voltage controlled oscillator.

21. An FM demodulator according to claim 19 or 20 in which the variable gain circuit includes a plurality of switched resistors switchable to select a desired gain.

22. An FM demodulator according to claim 21 in which a plurality of resistor selections are provided, each selection corresponding to a different one of a variety of required bandwidths.

23. An FM demodulator according to claim 19 in which a signal translation circuit is connected between the variable gain circuit and the voltage controlled oscillator.

24. An FM demodulator according to claim 19 in which said signal translation circuit has an input for receiving a set up voltage for setting up a default frequency in the phase locked loop.

25. A demodulating circuit for generating an audio signal from an FM carrier wave, which circuit comprises a gain control circuit for receiving an FM signal, a phase locked loop circuit coupled to the gain control circuit for locking onto a selected carrier wave frequency, said phase locked loop comprising a phase detector having a first input for receiving said FM carrier wave, a filter for filtering an output of the phase detector and a voltage controlled oscillator responsive to the filtered output of the phase detector and arranged to provide a second input to the phase detector for comparison with said FM carrier wave, said circuit including a variable gain circuit operable to select a desired gain for the phase locked loop, wherein said filtered output of the phase detector is varied by said variable gain circuit to alter the amount by which the frequency of the output of the voltage controlled oscillator changes in relation to a given filtered output of the phase detector thereby selecting a bandwidth for demodulation by the circuit, the filtered output of the phase detector representing said audio signal and including an amplitude detector for detecting amplitude variation in said selected carrier wave and providing a tuned gain control signal, said amplitude detector being coupled to said gain control circuitry to control the gain of said gain control circuit when the phase locked loop is locked onto the selected carrier wave.

26. A demodulating circuit according to claim 25 including further amplitude detecting circuitry coupled to receive a signal dependent of the amplitude of the FM input signal and generate an untuned gain control signal dependent upon all carrier waves in the FM input signal, said amplitude detecting circuit being connected to supply the untuned gain control signal to the gain control circuit.

27. A demodulating circuit according to claim 26 wherein said signal translation circuit has an input for receiving a set up voltage for setting up a default frequency in the phase locked loop.

28. A demodulating circuit according to claim 25 in which said variable gain circuit comprises a variable amplifier circuit coupled between the phase detector and the voltage controlled oscillator.

29. A demodulating circuit according to claim 25 in which the variable gain circuit includes a plurality of switched resistors switchable to select a desired gain.

30. A demodulating circuit according to claim 29 in which a plurality of resistor selections are provided, each selection corresponding to a different one of a variety of required bandwidths.

31. A demodulating circuit according to claim 25 including a signal translation circuit connected between the variable gain circuit and the voltage controlled oscillator.

* * * * *